United States Patent [19]

Fattaruso

[11] Patent Number: 5,305,004
[45] Date of Patent: Apr. 19, 1994

[54] DIGITAL TO ANALOG CONVERTER FOR SIGMA DELTA MODULATOR

[75] Inventor: John W. Fattaruso, Dallas, Tex.

[73] Assignee: Texas Instruments Incorporated, Dallas, Tex.

[21] Appl. No.: 954,195

[22] Filed: Sep. 29, 1992

[51] Int. Cl.⁵ ............................................. H03M 1/10
[52] U.S. Cl. ..................................... 341/120; 341/143
[58] Field of Search ............... 341/118, 119, 120, 121, 341/143, 144, 150; 375/26, 28, 34

[56] References Cited

U.S. PATENT DOCUMENTS

| | | | |
|---|---|---|---|
| 4,399,426 | 8/1983 | Khen-Sang Tan | 340/347 |
| 4,918,454 | 4/1990 | Early et al. | 341/172 |
| 5,006,854 | 4/1991 | White et al. | 341/172 |
| 5,144,308 | 1/1992 | Norsworthy | 341/131 |
| 5,191,331 | 3/1993 | Karema et al. | 341/131 |

OTHER PUBLICATIONS

"Digitally Corrected Multi-Bit ΣΔ Data Converters", T. Cataltepe, A. R. Kramer, L. E. Larson, G. C. Temes, and R. H. Walden, *IEEE*, 1989, pp. 647–650.

"Second-Order Sigma-Delta Modulation for Digital-Audio Signal Acquisition", Brian P. Brandt, Drew E. Wingard, and Bruce A. Wooley, *IEEE Journal of Solid-State Circuits*, vol. 26, No. 4, Apr. 1991, pp. 618–627.

"Error Correction Techniques for High-Performance Differential A/D Converters", Khen-Sang Tan, Sami Kiriaki, Michiel DeWit, John W. Fattaruso, Ching-Yuh Tsay, W. Edward Matthews, and Richard K. Hester, *IEEE Journal of Solid-State Circuits*, vol. 25, No. 6, Dec. 1990, pp. 1318–1327.

"A 16-Bit 4'th Order Noise-Shaping D/A Converter", L. Richard Carley and John Kenney, *IEEE*, 1988, pp. 21.7.1–21.7.4.

*Primary Examiner*—Brian K. Young
*Attorney, Agent, or Firm*—Jacqueline J. Garner; Richard L. Donaldson; William E. Hiller

[57] ABSTRACT

A second order sigma delta modulator (10) includes a digital to analog converter (26) that provides feedback for system modulation. The digital to analog converter (26) employs a dynamic element matching circuit (72) which randomly selects among main capacitors ($C_j$) to reduce the effect of capacitor value mismatching. The digital to analog converter (26) also employs a self calibration circuit (80) to trim the values of the main capacitors ($C_j$) to obtain better capacitor matching. During self calibration, a clock signal ($f_{rand}$) driving a pseudo random number generator (74) of the dynamic element matching circuit (72) is reduced to assist in minimizing variance in a digital output signal for accurate calibration of the main capacitors ($C_j$). Upon completion of calibration, the clock signal ($f_{rand}$) is returned to a frequency coinciding with the modulator clock rate.

20 Claims, 2 Drawing Sheets

DIGITAL TO ANALOG CONVERTER FOR SIGMA DELTA MODULATOR

TECHNICAL FIELD OF THE INVENTION

This invention relates in general to integrated circuit devices and more particularly to a digital to analog converter for a sigma delta modulator.

BACKGROUND OF THE INVENTION

Sigma delta modulators have achieved popularity for use in integrated circuit devices for both analog to digital and digital to analog conversion. Their attractiveness for integrated circuit systems is due in part to the fact that they employ a one bit digital to analog converter that is inherently perfectly linear and does not require precision component matching. However, single bit digital to analog converter performance is not sufficient to accomplish faster and higher resolution conversion required for state of the art devices. Though a one bit digital to analog converter achieves the desired linearity, accuracy and stability suffer as compared to multi-bit digital to analog converters. The quantization noise, which depends on the number of bits of precision in the analog to digital and digital to analog converters of the sigma delta modulator, decreases as more bits of precision are used in the converters.

The linearity of the resulting oversampled multi-bit system is essentially limited by the linearity of the digital to analog converter alone. The performance of multi-bit converters is generally degraded by internal digital to analog converter nonlinearity due to component mismatch. For high accuracy multi-bit digital to analog converters, off chip elements or trimming are needed to perform precision component matching in order to obtain the desired linearity. In conventional integrated circuit technology, a multi-bit digital to analog converter can only be built with inherent linearity of about ten bits. It is thus desirable to have an oversampling sigma delta modulator system with both quantization noise and linearity areas below the sixteen bit level and reduce degradation due to component mismatch. Such systems have achieved such a level with higher order modulators, but these higher order modulators have suffered from instability problems.

From the foregoing, it may be appreciated that a need has arisen for a digital to analog converter which achieves the advantages of accuracy, stability, and linearity. A need has also arisen for a digital to analog converter that performs precision component matching particularly suited to oversampled data systems. Further, a need has arisen for a second order sigma delta modulator that provides high resolution and reduces the effect on linearity caused by component mismatching.

SUMMARY OF THE INVENTION

In accordance with the present invention, a digital to analog converter is provided which substantially eliminates or reduces disadvantages and problems associated with prior digital to analog converters within sigma delta modulator systems.

The present invention includes a plurality of main circuit elements wherein each main circuit element corresponds to a separate bit of a received digital signal. Dynamic element matching circuitry randomly selects among the main circuit elements in response to the received digital signal for generation of an analog signal. Self calibration circuitry matches the main circuit elements such that they are calibrated to identical values.

The present invention provides various technical advantages over other digital to analog converters within the prior art. For example, one technical advantage is in performing both circuit element calibration and circuit element matching to reduce the effect of component mismatching and achieve linearity for a multi-bit converter. Another technical advantage is in providing a highly accurate, stable, and linear digital to analog converter for sigma delta modulation. Other technical advantages are readily apparent to one skilled in the art from the following descriptions, Figures, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
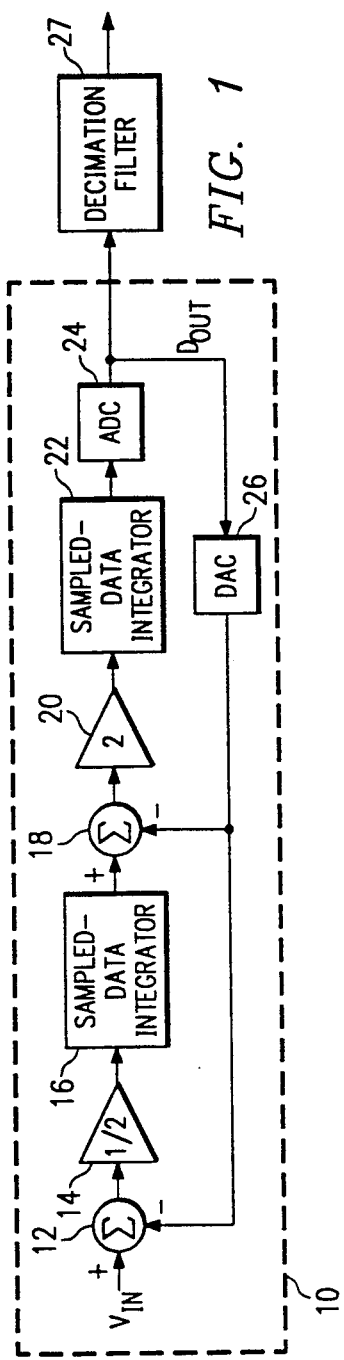
FIG. 1 illustrates a block diagram of an oversampled A to D converter comprising a sigma delta modulator and a following decimation filter.

FIG. 1 is a block diagram of a sigma delta modulator 10. Sigma delta modulator 10 receives an analog signal $V_{in}$ at summing node 12. The output of summing node 12 enters a first order of sigma delta modulator 10 comprising amplifier 14 and sample data integrator 16. A summing node 18 receives the resultant signal from sample data integrator 16. The output of summing node 18 enters a second order of sigma delta modulator 10 comprising amplifier 20 and sample data integrator 22. An analog to digital converter 24 receives the resultant signal from sample data integrator 22 and generates a digital output signal $D_{out}$. A digital to analog converter 26 receives digital output signal $D_{out}$ and provides a feedback analog signal to summing nodes 12 and 18. A decimation filter 27 removes unwanted high level noise from the digital output signal $D_{out}$.

Figure 2:
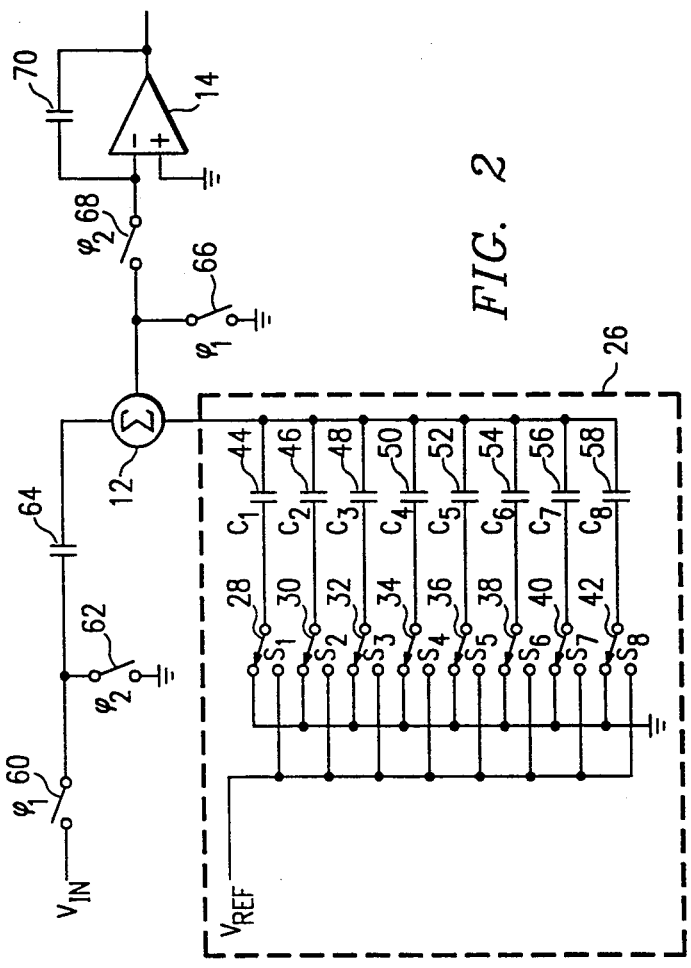
FIG. 2 illustrates a simplified schematic diagram of a digital to analog converter for the sigma delta modulator.

FIG. 2 is a simplified schematic diagram of digital to analog converter 26 including summing node 12 and amplifier 14. Digital to analog converter 26 includes switches 28, 30, 32, 34, 36, 38, 40, and 42 connected to corresponding capacitors 44, 46, 48, 50, 52, 54, 56, and 58, respectively. The output of this switched capacitor network connects to summing node 12. Analog input signal $V_{in}$ couples to summing node 12 through clock signal switches 60 and 62 and input capacitor 64. Summing node 12 provides the resultant signal to amplifier 14 through clock switching signals 66 and 68. A feedback capacitor 70 controls the gain of amplifier 14.

The actual implementation of digital to analog converter 26 is in the form of a switched capacitor network that feeds into summing node 12 of amplifier 14 and into sample data integrator 16. In operation, input capacitor 64 is charged with the analog input signal $V_{in}$ when clocking signal switches 60 and 66 are closed during clock phase $\phi_1$. Digital output signal $D_{out}$ from analog to digital converter 24 selectively controls switches S1 to S8 depending upon the particular binary three bit number being encoded. For those switches that activate, their corresponding capacitor charges to reference signal $V_{ref}$. Upon the closing of clocking signal switches 62 and 68 during clock phase $\phi_2$ clocking signal switches 60 and 66 open and the total charge stored in input capacitor 64 and selected capacitors C1 to C8 enter summing node 12 and amplifier 14. The total charge is then integrated onto feedback capacitor 70 as amplifier 14 settles back to the equilibrium state where the summing node 12 voltage is zero. For a second order sigma delta modulator, two of the switched capacitor networks are needed, one each to drive summing node 12 and summing node 18 of sample data integrators 16 and 22, respectively. The second switched capacitor network provides an analog signal for the second order of sigma delta modulator 10 comprising summing node 18, amplifier 20, and sampled data integrator 22 in the same manner as described above.

The linearity of multi-bit digital to analog converter 26 implementing such a switched capacitor network is dependent on the accuracy with which all the capacitor values match. With the present state of the art integrated circuit technology, an array of monolithic capacitors can be built with about one part per thousand, or ten bit, matching. If the second order modulator were built using this technology and run at an oversampled ratio of 256 to 1, then the total signal to noise ratio will be limited by the generation of harmonics at about $-80$ db due to the nonlinearity of the digital to analog converter. To improve linearity and negate the effect of component mismatching, dynamic element matching is performed wherein capacitors C1 to C8 are randomly selected instead of always using a fixed set of capacitors for each digital signal received by digital to analog converter 26.

Figure 3:
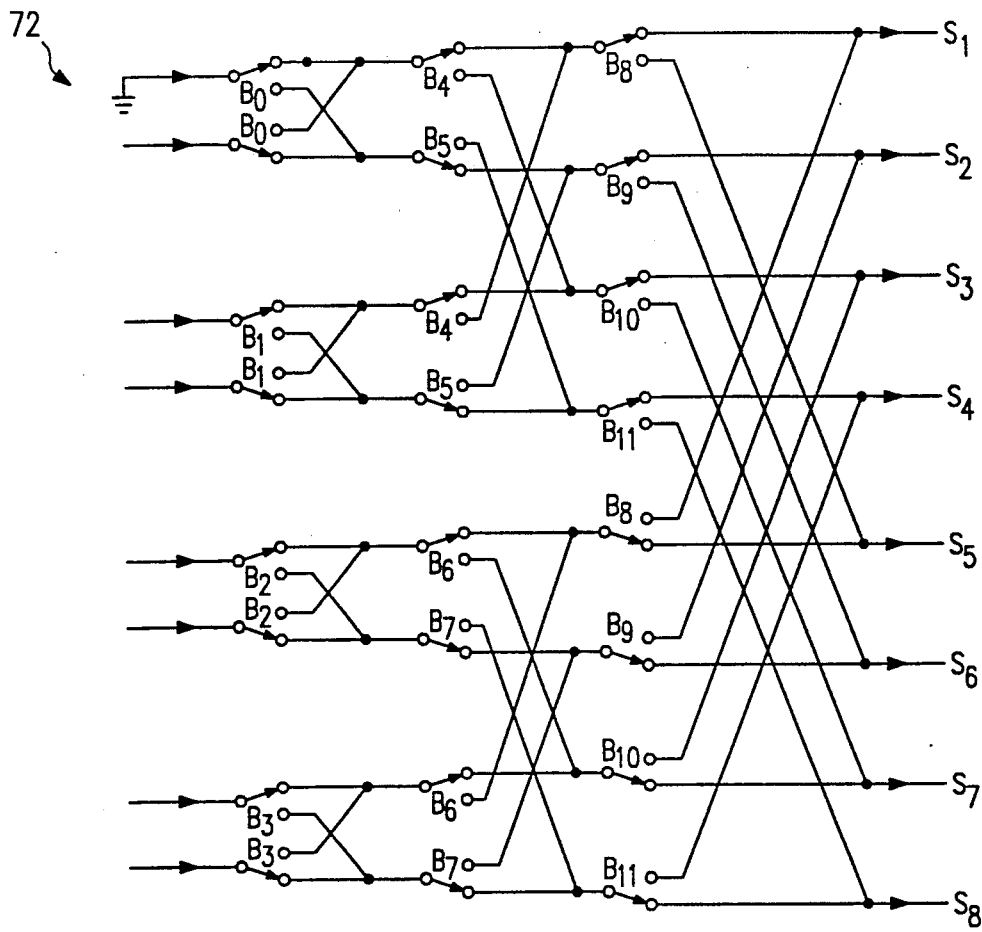
FIG. 3 illustrates a simplified schematic diagram of a dynamic element matching circuit for the digital to analog converter.

FIG. 3 is a simplified schematic diagram of a dynamic element matching circuit for digital to analog converter 26. Dynamic element matching circuit 72 comprises a randomizer network having a series of three butterfly structures coupling digital signal $D_{out}$ to the control lines for switches S1 through S8. A pseudo random number generator 74 determines 1 of 4,096 possible rerouting configurations of randomizer switches B0 to B11 for a twelve bit pseudo random number generator. Dynamic element matching circuit 72 varies which particular capacitor is chosen to be charged for each of the eight possible digital signals received by digital to analog converter 26. Preferably, pseudo random number generator 74 clock rate $f_{rand}$ is run at the same clock rate as digital to analog converter 26 to provide a new routing configuration for every clock period. Dynamic element matching circuit 72 removes the mechanism by which capacitor mismatch causes a systematic digital to analog converter nonlinearity and instead allows the mismatch to be a mechanism by which white noise is added to the modulator. The mismatch between the capacitors is converted into a white noise signal which is subsequently filtered out through the decimation filter. The addition of this randomizer network would yield a modulator with insignificant harmonic distortion, but with an increased noise floor of about $-90$ db as compared to the modulator without the randomizer network.

Though dynamic element matching circuit 72 eliminates some of the mismatch of the main capacitor C1 through C8, capacitor mismatch still prevents sigma delta modulator 10 from achieving the 98 to 100 db level required for high performance systems. To achieve the additional level of performance in sigma delta modulator 10, the main capacitors C1 to C8 are self calibrated using the random generator clock signal $f_{rand}$.

Figure 4:
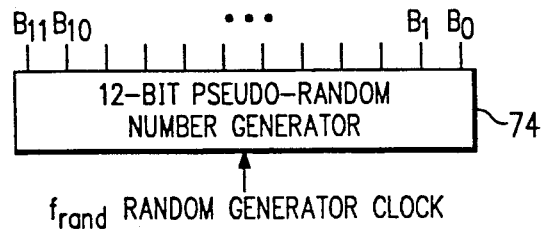
FIG. 4 illustrates a simplified schematic diagram of a self calibration circuit for the digital to analog converter.
Figure 4:
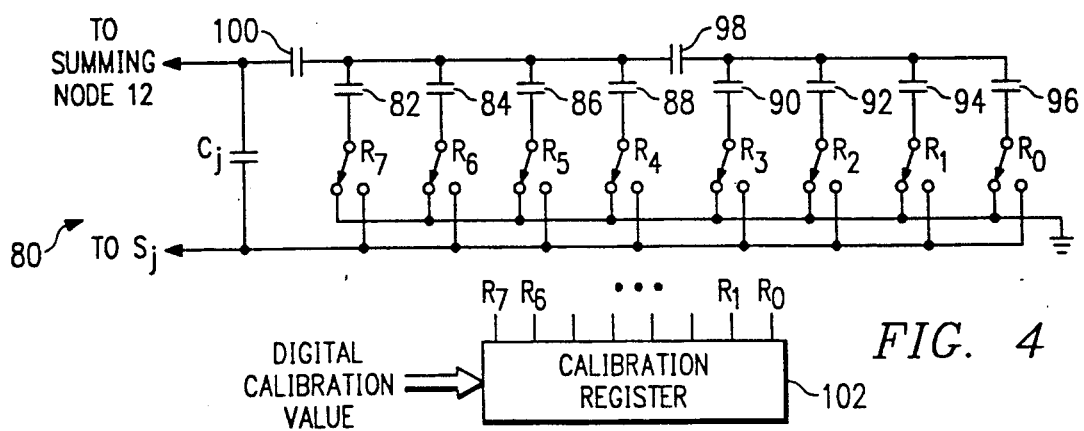

FIG. 4 is a simplified schematic diagram of a self calibration circuit 80 for calibrating each of the main capacitors C1 to C8. Each of the main capacitors C1 to C8 corresponds to a separate self calibration circuit 80 for trimming and controlling the value of the respective main capacitors C1 to C8. Self calibration circuit 80 includes binary weighted capacitors 82, 84, 86, and 88 for the most significant four bits of the trim capacitance, and capacitors 90, 92, 94, and 96 implementing the least significant four bits. These capacitors coupled to one of the main capacitors $C_j$, where j equals 1 to 8, through capacitors 98 and 100. Voltage reference signal $V_{ref}$, thru switches $S_j$ of FIG. 2 where j equals 1 to 8, selectively couples to the binary weighted capacitors through switches R7 to R0 that are controlled by a calibration register 102.

Self calibration circuit 80 allows the self calibration algorithm, running on a separate processor during test or power up, to load into the calibration registers the appropriate value that compensates for the random capacitance mismatch in the main capacitors $C_j$. The calibration value loaded into calibration register 102 determines which of the switches R7 to R0 activates to connect appropriate binary weighted capacitors to voltage reference signal $V_{ref}$. Capacitor 98 is a coupling capacitor that keeps a total capacitance ratio that must be realized at 16 instead of 256 for a completely binary weighted eight bit array in order to keep chip area reasonable. Capacitor 100 is an attenuation capacitor that allows the array capacitance, selected by the digital calibration value, to trim capacitor $C_j$ slightly around its nominal value.

With the main capacitor $C_j$ calibrated, digital to analog converter 26 will closely approximate the ideal case where all main capacitors have exactly the same value. However, due to electronic device noise in sigma delta modulator 10 circuitry, there is always an inherent limit to how precisely the mismatch errors in the main capacitors may be corrected. Typically, capacitors may be calibrated down to the point where there are residual errors in the 14 to 16 bit range. In the situation described above, calibrating the main capacitors down to fourteen bit mismatch will allow the random dynamic element matching technique to eliminate significant harmonic distortion yet keep the white noise level in the pass band of the decimation filter to about $-100$ db. A sixteen bit calibration leaves a noise level below $-120$ db. Thus, the combination of random capacitor selection and self calibration allows a second order modulator to achieve high performance requirements with ten bit capacitor manufacturing variability.

In order for the proper compensation value to be loaded into each of the capacitor calibration registers, the inherent mismatch of each capacitor must be measured. With dynamic element matching circuit 72 running and the analog input signal grounded, the digital output from the decimation filter will be a sequence of values whose mean will be zero and whose statistical variance is the noise floor of the oversampled analog to digital converter. With perfect capacitor matching, this noise floor will be below about −120 db, but in practice will be limited considerably above this level due to device noise. In principle, a self calibration algorithm may calculate the statistical variance in the sequence of digital values when no input is applied and adjust the value in each of the calibration registers until this variance value is at a minimum. This adjustment may be accomplished by any number of multi-variable nonlinear function minimization algorithms. In practice, however, the presence of device noise will tend to mask the white noise injected by dynamic element matching circuit 72 when the capacitors are close to their proper calibration points, rendering the algorithm ineffective. To make the self calibration algorithm effective, the frequency of the clock signal $f_{rand}$ to pseudo random numbered generator 74 must be changed.

For calibration purposes only, clock signal $f_{rand}$ is lowered from the clock rate for sigma delta modulator 10 to a frequency that is half the cutoff frequency of the decimation frequency. The noise inserted by the randomizer network and proportional to the level of capacitor mismatches will have a large amount of its energy in the band of frequencies passed by the decimation filter. The statistical variance in the digital output stream due to mismatch will be amplified by 10 or 20 db relative to keeping clock signal $f_{rand}$ at the sigma delta modulator 10 clock rate. This will raise much of the mismatch noise above the noise floor established by device noise and allow the self calibration algorithm to make an accurate determination of the proper values to load into each calibration register. Once self calibration has been performed, clock signal $f_{rand}$ is set back to the modulator clock frequency.

Though the circuits have been shown and described using three bits of quantization, the present invention may employ various levels of resolution for digital to analog converter 26. Further, the exemplary modulator circuit has been shown and described for a single ended system, but may also be implemented with a fully differential system. To be fully differential, the switch capacitor networks are duplicated and two analog input signals $V_{in}+$ and $V_{in}-$ and two reference voltages $V_{ref}+$ and $V_{ref}-$ are required. The circuit nodes connected to ground in the singled ended system will either go to an opposite phase input or reference line or to a common mode bias voltage. The same system operation principles described above apply for the fully differential system. Also, simulations show that only the main capacitors that feed charge to the first amplifier 14 and sample integrated 16 need be calibrated. Mismatch errors in the second order portion of sigma delta modulator 10 do not contribute significant noise or distortion in the operation of the modulator.

In summary, a second order sigma delta modulator incorporates a digital to analog converter implementing dynamic element matching to reduce the effect of mismatch between the main capacitor elements. A self calibration circuit for each main capacitor element trims the capacitor values of the main capacitor elements so that the digital to analog converter will have matching main capacitor elements. A clock signal driving a pseudo random number generator for the dynamic element matching circuit is reduced during calibration to allow effective performance of the self calibration algorithm.

Thus, is it apparent that there has been provided, in accordance with the present invention, a digital to analog converter for a second order sigma delta modulator that satisfies the objects, aims, and advantages set forth above. Although the preferred embodiment has been described in detail, it should be understood that various changes, substitutions, and alterations may be made herein. For example, many of the direct connections illustrated herein could be altered by one skilled in the art such that two elements are merely coupled to one another through an intermediate element or elements without being directly connected as illustrated in the preferred embodiment. Other examples are readily ascertainable by one skilled in the art and could be made without departing from the spirit and scope of the invention as defined by the following claims.

What is claimed is:

1. A digital to analog converter for converting a digital signal, comprising:
    a plurality of storage elements, each storage element representing a separate value of said digital signal;
    dynamic element matching circuitry to randomly select among said storage elements, wherein said dynamic element matching circuitry includes a series of butterfly networks for switching input signals corresponding to said digital signal onto control lines for activating said storage elements; and
    self calibration circuitry to match said storage elements to each other such that said storage elements have identical values.

2. The digital to analog converter of claim 1, wherein said dynamic element matching circuitry includes a pseudo-random number generator, said pseudo-random number generator controlled by a generator clock.

3. The digital to analog converter of claim 2, wherein said generator clock controls matching of said storage elements by said self calibration circuitry.

4. The digital to analog converter of claim 1, wherein said storage elements are capacitors.

5. The digital to analog converter of claim 1, wherein said pseudo-random number generator controls switching within said butterfly networks.

6. The digital to analog converter of claim 1, wherein said self calibration circuitry includes a binary weighted capacitor array coupled to each storage element for adjusting a value for each storage element such that each storage element has an identical value.

7. The digital to analog converter of claim 6, wherein said calibration circuitry includes a calibration register for selectively activating each capacitor within said binary weighted capacitor array in response to a digital calibration value.

8. A sigma delta modulator, comprising:
    a first integrator controlled by a modulator clock for receiving an analog input signal;
    a second integrator coupled to said first integrator and controlled by said modulator clock;
    an analog to digital converter coupled to said second integrator for generating a digital output signal in response to said analog input signal;
    a digital to analog converter coupled to said analog to digital converter, said digital to analog converter receives said digital output signal from said analog to digital converter and provides said first and second integrators with a corresponding analog feedback signal, said digital to analog converter comprising:

a plurality of main capacitors, each main capacitor representing a specific value of said digital output signal received by said digital to analog converter;

dynamic element matching circuit to randomly select among said main capacitors according to said digital output signal;

self calibration circuit to match said main capacitors to each other such that said main capacitors have identical values; and a decimation filter for eliminating undesirable noise in said digital output signal.

9. The sigma delta modulator of claim 8, wherein said dynamic element matching circuit includes a pseudo-random number generator controlled by a generator clock, said generator clock runs at a same clock rate as said modulator clock during non-calibration operation.

10. The sigma delta modulator of claim 9, wherein said generator clock runs at a slower rate than said modulator clock during calibration operation.

11. The sigma delta modulator of claim 9, wherein said dynamic element matching circuit includes a series of butterfly networks for randomly switching signals onto control lines for activating said main capacitors.

12. The sigma delta modulator of claim 11, wherein said pseudo-random number generator controls switching within said butterfly networks.

13. The sigma delta modulator of claim 9, wherein said self calibration circuit includes a binary weighted capacitor array for adjusting a value of each main capacitor such that each main capacitor has an identical value.

14. The sigma delta modulator of claim 14, wherein said self calibration circuit includes a calibration register for selectively activating capacitors within said binary weighted capacitor array in response to a digital calibration value.

15. The sigma delta modulator of claim 14, wherein said digital calibration value is determined by decreasing said pseudo-random number generator clock rate below said modulator clock rate and grounding said analog input signal in order to minimize a statistical variance for said digital output signal.

16. The sigma delta modulator of claim 15, wherein said clock rate of said pseudo-random number generator is reduced to half a cutoff frequency of said decimation filter.

17. A method of calibrating capacitors of a digital to analog converter within a sigma delta modulator, comprising the steps of:

grounding an analog input signal;

decreasing a clock rate of a pseudo-random number generating capacitor selector within the digital to analog converter below a clock rate of the sigma delta modulator;

determining a statistical variance in a digital output signal generated by the sigma delta modulator; and adjusting a value of each capacitor such that each capacitor has an identical value in order to minimize said statistical variance.

18. The method of claim 17, wherein said adjusting step includes changing a digital calibration value for a calibration register controlling said values.

19. The method of claim 18, wherein said adjusting step includes trimming said value of each capacitor through a binary weighted capacitor array controlled by said calibration register.

20. The method of claim 19, further comprising the step of:

increasing said clock rate of said pseudo-random number generating capacitor selector to coincide with said clock rate of the sigma delta modulator upon completion of calibration.

* * * * *